United States Patent
Lin et al.

(10) Patent No.: US 10,510,720 B2
(45) Date of Patent: Dec. 17, 2019

(54) ELECTRONIC PACKAGE AND METHOD FOR FABRICATING THE SAME

(71) Applicant: Siliconware Precision Industries Co., Ltd., Taichung (TW)

(72) Inventors: Chang-Fu Lin, Taichung (TW); Chin-Tsai Yao, Taichung (TW); Kuo-Hua Yu, Taichung (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/372,638

(22) Filed: Dec. 8, 2016

(65) Prior Publication Data

US 2018/0061810 A1   Mar. 1, 2018

(30) Foreign Application Priority Data

Aug. 31, 2016   (TW) .............................. 105128137 A

(51) Int. Cl.
*H01L 23/31*        (2006.01)
*H01L 25/065*       (2006.01)
(Continued)

(52) U.S. Cl.
CPC ........ *H01L 25/0657* (2013.01); *H01L 21/563* (2013.01); *H01L 23/3128* (2013.01); *H01L 23/49811* (2013.01); *H01L 23/5385* (2013.01); *H01L 23/5389* (2013.01); *H01L 24/09* (2013.01); *H01L 24/16* (2013.01); *H01L 24/17* (2013.01); *H01L 24/33* (2013.01); *H01L 24/81* (2013.01); *H01L 25/105* (2013.01); *H01L 25/50* (2013.01); *H01L 24/32* (2013.01); *H01L 24/48* (2013.01); *H01L 24/73* (2013.01); *H01L 24/92* (2013.01); *H01L 2224/0401* (2013.01);
(Continued)

(58) Field of Classification Search
None
See application file for complete search history.

(56) References Cited

U.S. PATENT DOCUMENTS

2002/0017721 A1\* 2/2002 Huang ................ H01L 21/4853
                                                      257/724
2005/0006745 A1\* 1/2005 Nishimura ............ H01L 25/105
                                                      257/686
(Continued)

*Primary Examiner* — Joseph C. Nicely
*Assistant Examiner* — Lamont B Koo
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, which includes: a first substrate; a first electronic component disposed on the first substrate; a second substrate stacked on the first substrate through a plurality of first conductive elements and a plurality of second conductive elements and bonded to the first electronic component through a bonding layer; and a first encapsulant formed between the first substrate and the second substrate. The first conductive elements are different in structure from the second conductive elements so as to prevent a mold flow of the first encapsulant from generating an upward pushing force during a molding process and hence avoid cracking of the second substrate. The present disclosure further provides a method for fabricating the electronic package.

30 Claims, 4 Drawing Sheets

(51) Int. Cl.
  *H01L 25/10*  (2006.01)
  *H01L 23/498* (2006.01)
  *H01L 23/538* (2006.01)
  *H01L 21/56*  (2006.01)
  *H01L 23/00*  (2006.01)
  *H01L 25/00*  (2006.01)

(52) U.S. Cl.
  CPC ........... *H01L 2224/04042* (2013.01); *H01L 2224/13541* (2013.01); *H01L 2224/16013* (2013.01); *H01L 2224/16237* (2013.01); *H01L 2224/1703* (2013.01); *H01L 2224/17055* (2013.01); *H01L 2224/17132* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2224/92225* (2013.01); *H01L 2224/97* (2013.01); *H01L 2225/0651* (2013.01); *H01L 2225/0652* (2013.01); *H01L 2225/06517* (2013.01); *H01L 2225/06572* (2013.01); *H01L 2225/06589* (2013.01); *H01L 2225/1023* (2013.01); *H01L 2225/1041* (2013.01); *H01L 2225/1058* (2013.01); *H01L 2924/15311* (2013.01); *H01L 2924/15331* (2013.01); *H01L 2924/3512* (2013.01)

(56) References Cited

U.S. PATENT DOCUMENTS

| | | | | |
|---|---|---|---|---|
| 2009/0246474 | A1* | 10/2009 | Sakurai | H01L 21/563 428/172 |
| 2015/0187723 | A1* | 7/2015 | Huang | H01L 23/3135 257/738 |
| 2016/0020193 | A1* | 1/2016 | Lee | H01L 28/40 257/774 |

* cited by examiner

ELECTRONIC PACKAGE AND METHOD FOR FABRICATING THE SAME

CROSS-REFERENCE TO RELATED APPLICATION

This application claims under 35 U.S.C. § 119(a) the benefit of Taiwanese Patent Application No. 105128137 filed Aug. 31, 2016, the entire contents of which are incorporated herein by reference.

BACKGROUND

1. Technical Field

The present disclosure relates to package structures, and, more particularly, to an electronic package and a method for fabricating the same.

2. Description of Related Art

Along with the rapid development of portable electronic products, related products have been developed toward the trend of high density, high performance and miniaturization. Accordingly, various package on package (PoP) technologies have been developed to meet the requirements of high density and miniaturization.

FIG. 1 is a schematic cross-sectional view of a conventional PoP electronic package 1. The electronic package 1 has a first package structure 1a, a second package structure 1b stacked on the first package structure 1a, and an encapsulant 13 encapsulating the first package structure 1a and the second package structure 1b. The first package structure 1a has a first substrate 10, a first electronic component 11 such as a semiconductor chip bonded to the first substrate 10 in a flip-chip manner through a plurality of conductive bumps 110, and an underfill 111 encapsulating the conductive bumps 110. The second package structure 1b has a second substrate 12, a plurality of second electronic components 14 such as semiconductor chips bonded to the second substrate 12 in a flip-chip manner through a plurality of conductive bumps 140, and an underfill 141 encapsulating the conductive bumps 140. The second substrate 12 is supported on and electrically connected to the first substrate 10 through a plurality of solder balls 120. The encapsulant 13 is formed between the first substrate 10 and the second substrate 12 and encapsulates the solder balls 120.

However, in the conventional electronic package 1, after the solder balls 120 between the first substrate 10 and the second substrate 12 are reflowed, stresses are generated due to a temperature change, and cause a portion of the second substrate 12 to become uneven. As such, during a subsequent molding process, the second substrate 12 cannot be in effective contact with a surface of a mold. Therefore, when a molding compound for forming the encapsulant 13 flows between the first substrate 10 and the second substrate 12, the mold flow generates an upward pushing force, which causes cracking between the solder balls 120 and the second substrate 12, and hence leads to a poor electrical performance.

Further, after the reflow process is performed, the solder balls 120 may have significant differences in size and height from one another. As such, defects may occur to solder joints and result in a poor electrical connection quality. Also, the solder balls 120 arranged in a grid array may have a poor coplanarity. Consequently, uneven stresses may be applied on the solder joints, thus likely leading to a tilted bonding between the first package structure 1a and the second package structure 1b and even causing an offset of the solder joints.

Therefore, there is a need to provide an electronic package and a method for fabricating the same so as to overcome the above-described drawbacks.

SUMMARY

In view of the above-described drawbacks, the present disclosure provides an electronic package, which comprises: a first substrate; a first electronic component disposed on the first substrate; a second substrate stacked on the first substrate through a plurality of first conductive elements and a plurality of second conductive elements and bonded to the first electronic component through a bonding layer, wherein the first conductive elements are different in structure from the second conductive elements; and a first encapsulant formed between the first substrate and the second substrate and encapsulating the first electronic component, the first conductive elements and the second conductive elements.

The present disclosure further provides a method for fabricating an electronic package, which comprises: providing a first substrate and a second substrate with a first electronic component disposed on the first substrate; stacking the second substrate on the first substrate through a plurality of first conductive elements and a plurality of second conductive elements and bonding the second substrate to the first electronic component through a bonding layer, wherein the first conductive elements are different in structure from the second conductive elements; and forming between the first substrate and the second substrate a first encapsulant that encapsulates the first electronic component, the first conductive elements and the second conductive elements.

In an embodiment, the ratio of the number of the first conductive elements to the number of the second conductive elements is 1:0.5 to 1:1.5.

In an embodiment, the first conductive elements are metal bumps. In another embodiment, each of the first conductive elements is a metal bump with a conductive material encapsulating the metal bump.

In an embodiment, the second conductive elements are solder bumps.

In an embodiment, the bonding layer is made of a thin film or a heat dissipating material.

In an embodiment, a surface of the first substrate is defined with a chip mounting area and a first stack area and a second stack area surrounding the chip mounting area, wherein the first electronic component is disposed on the chip mounting area, and a plurality of conductive pads are disposed on the first stack area and the second stack area and bonded with at least one of the first conductive elements and the second conductive elements. In one embodiment, the density of the conductive pads on the first stack area is greater than the density of the conductive pads on the second stack area.

In an embodiment, a positioning pad is disposed on the first substrate.

In an embodiment, the first conductive elements and the second conductive elements are alternately arranged.

In an embodiment, a supporting member is further formed between the first substrate and the second substrate. In another embodiment, the supporting member is free from being electrically connected to the first substrate or the second substrate.

In an embodiment, a second electronic component is further disposed on the second substrate.

In an embodiment, a second encapsulant is further formed on the second substrate and encapsulates the second electronic component.

In an embodiment, an additional package is further disposed on the second substrate.

According to the present disclosure, the first conductive elements and the second conductive elements of different structures are provided to support the second substrate. After the first and second conductive elements are reflowed, stress concentration caused due to a temperature change is reduced so as to prevent local unevenness of the second substrate. Compared with the prior art, the present disclosure allows a surface of the second substrate to be in effective contact with a surface of a mold during a molding process so as to prevent a mold flow of the first encapsulant from generating an upward pushing force and thereby prevent cracking of the second substrate.

Further, by bonding the second substrate to the first electronic component, the distance between the second substrate and the first substrate is fixed. Therefore, after the first and second conductive elements are reflowed, the joints formed of the first and second conductive elements have a good electrical connection quality and the grid array arranged by the first and second conductive elements has a good coplanarity, thereby maintaining even joint stresses to prevent a tilted bonding from occurring between the first substrate and the second substrate and avoid an offset of the joints.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

Figure 1:
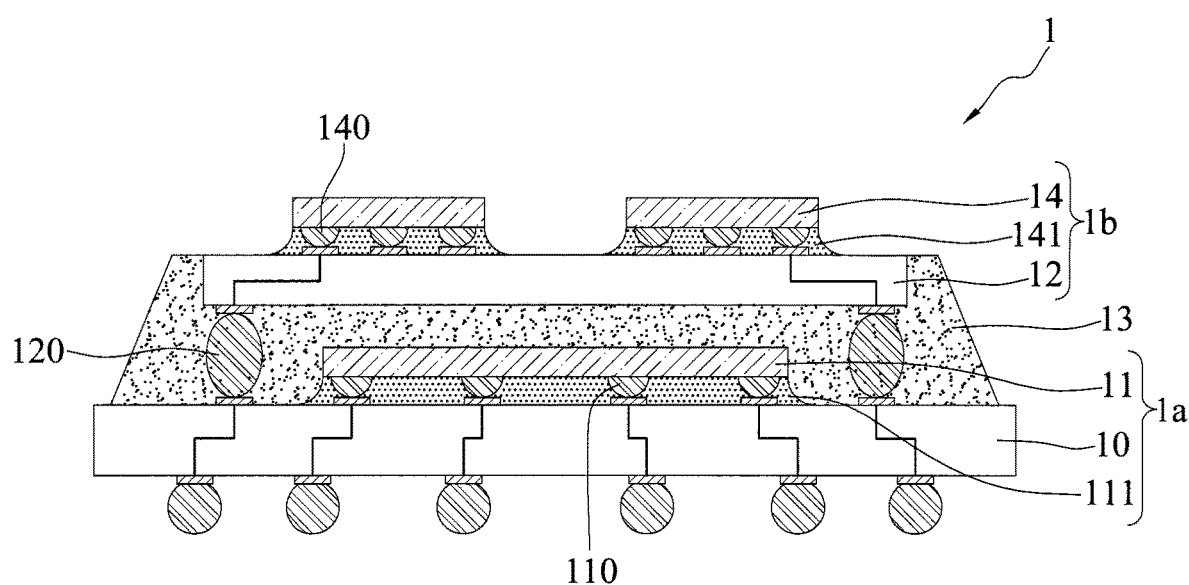
FIG. 1 is a schematic cross-sectional view of a conventional PoP electronic package.
Figure 2A:
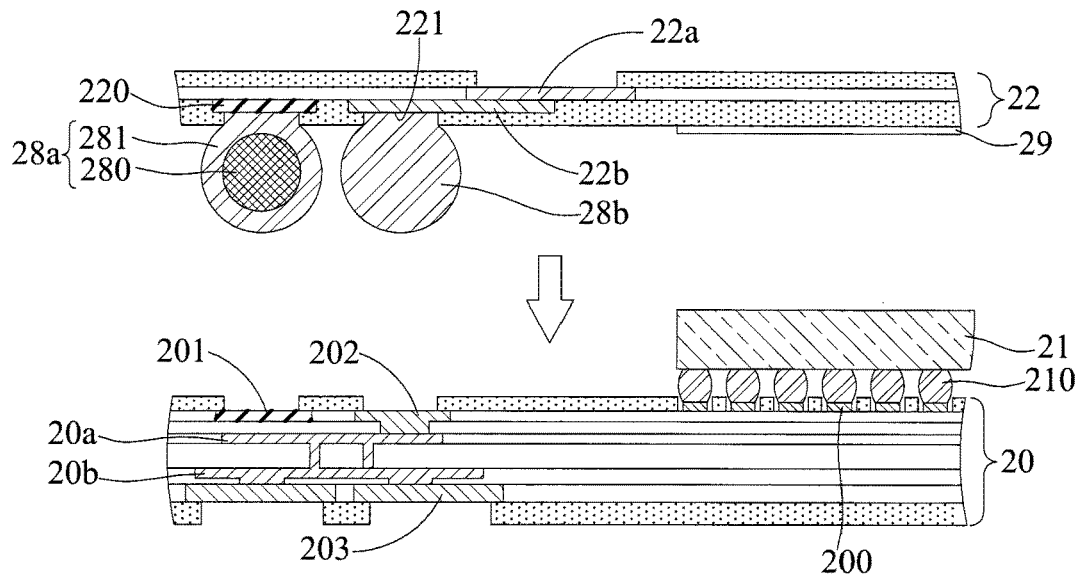
FIGS. 2A to 2C are schematic cross-sectional views showing a method for fabricating an electronic package according to the present disclosure, wherein FIG. 2B' shows another embodiment of FIG. 2B.
Figure 2B:
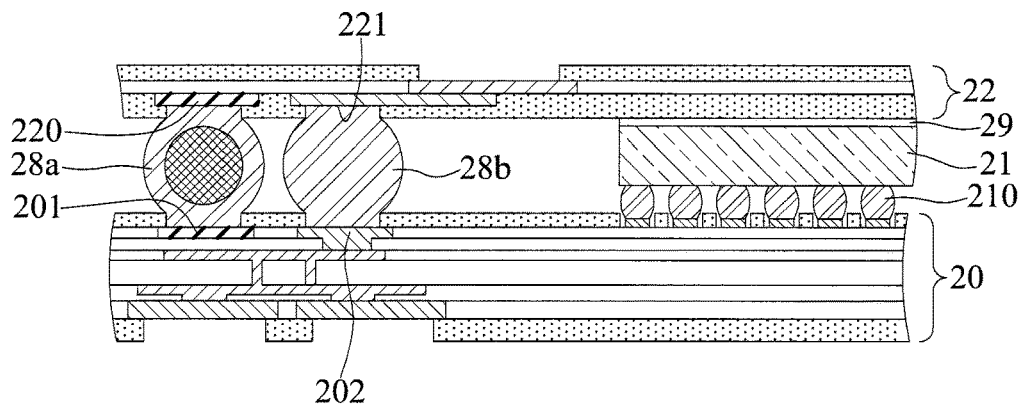
Figure 2B:
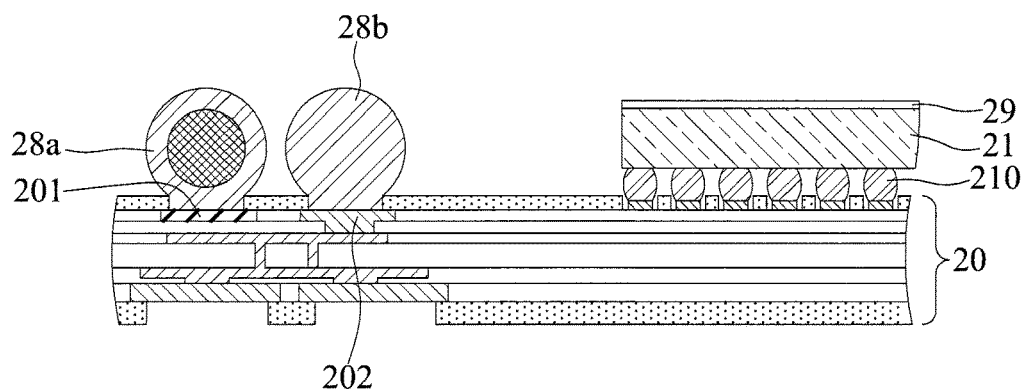
Figure 2C:
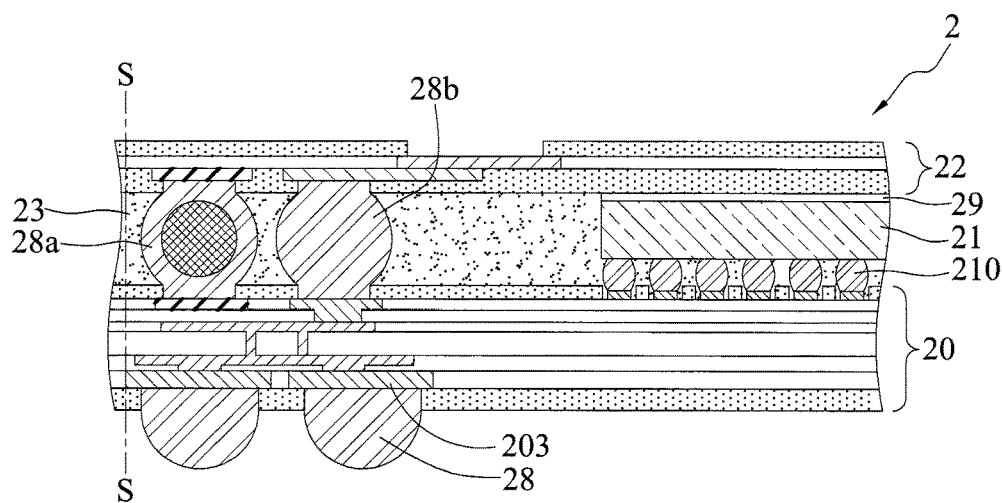

FIGS. 2A to 2C are schematic cross-sectional views showing a method for fabricating an electronic package 2 according to the present disclosure.

Referring to FIG. 2A, a first substrate 20 and a second substrate 22 are provided. At least one first electronic component 21 is disposed on the first substrate 20, and a plurality of first conductive elements 28a, a plurality of second conductive elements 28b and a bonding layer 29 made of a thin film or a heat dissipating material are formed on a lower side of the second substrate 22.

In an embodiment, the first substrate 20 is a circuit board having a plurality of first circuit layers 20a and 20b, and the second substrate 22 is a circuit board having a plurality of second circuit layers 22a and 22b. The first circuit layers 20a and 20b include a plurality of conductive pads 200, 201, 202 and 203. The second circuit layers 22a and 22b include a plurality of conductive pads 220 and 221.

The first electronic component 21 is disposed on the conductive pads 200 on an upper side of the first substrate 20 through a plurality of conductive bumps 210 in a flip-chip manner.

Further, the first conductive elements 28a are disposed on the conductive pads 220 on the lower side of the second substrate 22. Each of the first conductive elements 28a has a metal bump 280 and a conductive material 281 encapsulating the metal bump 280. Alternatively, each of the first conductive elements 28a is only made of the metal bump 280. The metal bump 280 is a copper ball, and the conductive material 281 is a solder material, such as nickel-tin, tin-lead or tin-silver.

Furthermore, the second conductive elements 28b are disposed on the conductive pads 221 on the lower side of the second substrate 22. The second conductive elements 28b are solder bumps. In an embodiment, the ratio of the number of the first conductive elements 28a to the number of the second conductive elements 28b is 1:0.5 to 1:1.5, preferably 1:1.

Referring to FIG. 2B, the second substrate 22 is stacked on the first substrate 20. In an embodiment, the second substrate 22 is bonded to the first electronic component 21 through the bonding layer 29, and the first conductive elements 28a and the second conductive elements 28b are electrically connected to the conductive pads 201, 202 of the first substrate 20 so as to electrically connect the second substrate 22 to the first substrate 20.

Figure 3:
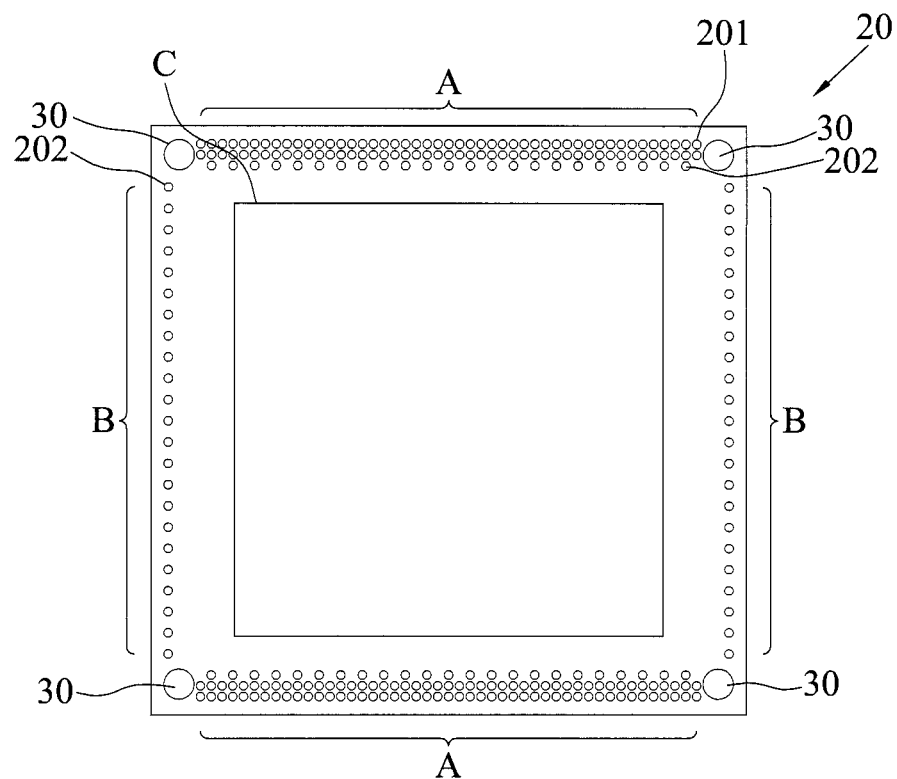
FIG. 3 is a schematic upper view of a first substrate of the electronic package according to the present disclosure.

Referring to FIG. 3, a chip mounting area C and a first stack area A and a second stack area B surrounding the chip mounting area C are defined on a surface of the first substrate 20 (or the second substrate 22). The conductive pads 200 (not shown in FIG. 3) are disposed on the chip mounting area C, and the conductive pads 201 and 202 are disposed on the first stack area A and the second stack area B. The density of the conductive pads 201 and 202 on the first stack area A is greater than the density of the conductive pads 202 on the second stack area B.

Figure 4:
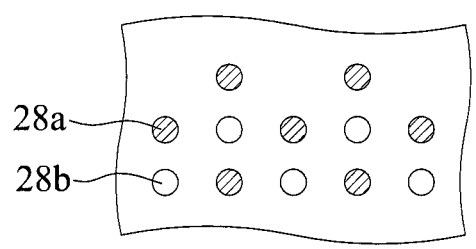
FIG. 4 is a partial upper view of the first substrate having first and second conductive elements formed thereon according to the present disclosure.

Further, on the first stack area A, a portion of the conductive pads 201 is bonded to the first conductive elements 28a, and a portion of the conductive pads 202 is bonded to the second conductive elements 28b. Referring to FIG. 4, the first conductive elements 28a and the second conductive elements 28b are alternately arranged. As such, the first conductive elements 28a each having the metal bump 280 and the conductive material 281 encapsulating the metal bump 280 not only provide a supporting effect, but also prevent from an occurrence of solder bridging. On the second stack area B, the conductive pads 202 are bonded to the second conductive elements 28b such as solder bumps to reduce cost.

In an alternative embodiment, referring to FIG. 2B', the bonding layer 29 can be formed on the first electronic component 21, and the first conductive elements 28a and the second conductive elements 28b can be disposed on the conductive pads 201 and 202 of the first substrate 20.

Referring to FIG. 2C, following FIG. 2B, a first encapsulant 23 is formed between the upper side of the first substrate 20 and the lower side of the second substrate 22 and encapsulates the first electronic component 21, the first conductive elements 28a, the second conductive elements 28b, the bonding layer 29 and the conductive bumps 210.

Then, a singulation process is performed along a cutting path S to obtain a plurality of electronic packages 2.

In an embodiment, since the bonding layer 29 is formed between the second substrate 22 and the first electronic component 21, the first encapsulant 23 will not be filled between the second substrate 22 and the first electronic component 21.

Further, conductive elements 28 such as solder balls can be disposed on the conductive pads 203 on a lower side of the first substrate 20 for an electronic structure such as a circuit board to be bonded therewith.

Figure 2D:
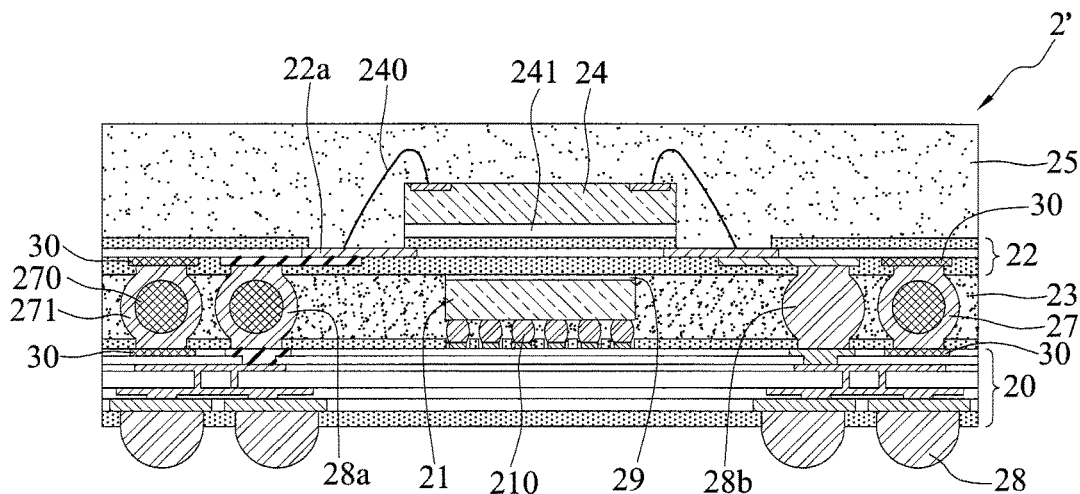
FIGS. 2D and 2D' are schematic cross-sectional views showing other embodiments of FIG. 2C.
Figure 2D:
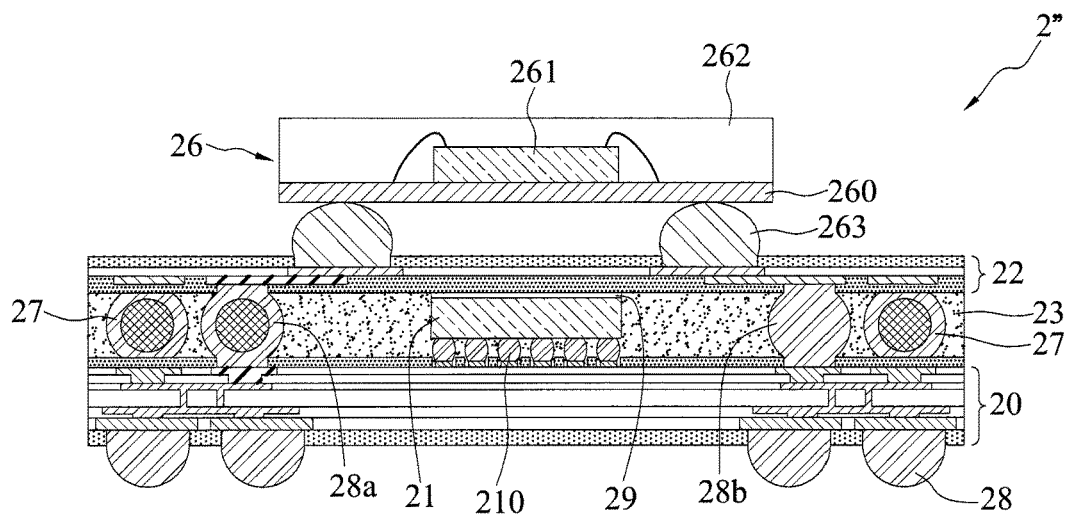

FIG. 2D shows an electronic package 2' according to another embodiment of the present disclosure. At least one second electronic component 24 is disposed on an upper side of the second substrate 22 through an adhesive layer 241, and a second encapsulant 25 is formed on the upper side of the second substrate 22 and encapsulates the second electronic component 24. In an embodiment, the second electronic component 24 is electrically connected to the second circuit layer 22a on the upper side of the second substrate 22 through a plurality of bonding wires 240, and the bonding wires 240 are encapsulated by the second encapsulant 25. In other embodiments, the second electronic component 24 can be disposed on the upper side of the second substrate 22 in a flip-chip manner.

FIG. 2D' shows an electronic package 2" according to a further embodiment of the present disclosure. At least one package 26 is disposed on the second substrate 22. The package 26 has a carrier 260, a third electronic component 261 disposed on and electrically connected to the carrier 260, and an encapsulant 262 encapsulating the third electronic component 261. In an embodiment, the package 26 is electrically connected to the second substrate 22 through a plurality of conductive elements 263 such as solder balls. The third electronic component 261 can be electrically connected to the carrier through wire bonding (as shown in FIG. 2D') or in a flip-chip manner.

Further, referring to FIG. 2D, at least one supporting member 27 is provided between the first substrate 20 and the second substrate 22 and supports the second substrate 22 on the first substrate 20, and the supporting member 27 is encapsulated by the first encapsulant 23.

In an embodiment, the supporting member 27 is similar in structure to the first conductive elements 28a. That is, the supporting member 27 has a metal bump 270 and a conductive material 271 encapsulating the metal bump 270. The metal bump 270 is a copper ball, and the conductive material 271 is a solder material, such as nickel-tin, tin-lead or tin-silver.

The supporting member 27 can be fabricated along with the first conductive elements 28a. Further, a positioning pad 30 can be disposed on the first substrate 20 and/or the second substrate 22 to facilitate positioning of the supporting member 27. In an embodiment, the positioning pad 30 is not electrically connected to the first circuit layers 20a and 20b of the first substrate 20 or the second circuit layers 22a and 22b of the second substrate 22. Accordingly, the supporting member 27 is not electrically connected to the first substrate 20 or the second substrate 22. The supporting member 27 can be viewed as a dummy metal member. In another embodiment, referring to FIG. 2D', the positioning pad 30 is omitted, and the supporting member 27 is in direct contact with surfaces of the first substrate 20 and the second substrate 22.

Further, referring to FIG. 3, a plurality of positioning pads 30 (or supporting members 27) are provided at junctions of the first stack area A and the second stack area B (or at four corners of the surface of the first substrate 20). It should be understood that the positioning pads 30 (or the supporting members 27) can be provided at any position of the surface of the first substrate 20.

Each of the above-described electronic components (for example, the first electronic component 21, the second electronic component 24 or the third electronic component 261) can be an active component such as a semiconductor chip, a passive component, such as a resistor, a capacitor or an inductor, or a combination thereof.

According to the present disclosure, the first conductive elements 28a and the second conductive elements 28b of different structures are provided to support the second substrate 22. After the second conductive elements 28b (and the first conductive elements 28a, if the first conductive elements 28a include a solder material) are reflowed, stress concentration caused by a temperature change is reduced so as to prevent local unevenness of the second substrate 22. Compared with the prior art, the present disclosure allows the surface of the second substrate 22 to be in effective contact with a surface of a mold during a molding process so as to prevent a mold flow of the first encapsulant 23 from generating an upward pushing force. Therefore, the present disclosure not only avoids bridging between the first conductive elements 28a and the second conductive elements 28b but also prevents cracking of the second substrate 22.

Further, by bonding the second substrate 22 to the first electronic component 21 through the bonding layer 29, the present disclosure achieves a good supporting effect. The distance between the second substrate 22 and the first substrate 20 is fixed and thus the height and size of the first and second conductive elements 28a and 28b can be controlled. Therefore, after the first and second conductive elements 28a and 28b are reflowed, the joints formed of the first and second conductive elements 28a, 28b have a good electrical connection quality and the grid array arranged by the first and second conductive elements 28a, 28b has a good coplanarity, thus maintaining even joint stresses so as to prevent a tilted bonding from occurring between the first substrate 20 and the second substrate 22 and avoid an offset of the joints.

Furthermore, during the molding process of the first encapsulant 23, when the molding compound of the first encapsulant 23 generates an upward pushing force, the bonding layer 29 facilitates to absorb stresses so as to reduce stresses applied on the first and second conductive elements 28a and 28b and thereby prevent cracking of the first and second conductive elements 28a and 28b.

In addition, the supporting member 27 provides a supporting effect to prevent collapse of the second substrate 22 that would otherwise cause bridging of the second conductive elements 28b (and the first conductive elements 28a).

The present disclosure further provides an electronic package 2, 2', 2", which has: a first substrate 20; a first electronic component 21 disposed on the first substrate 20; a second substrate 22 stacked on the first substrate 20 through a plurality of first conductive elements 28a and a plurality of second conductive elements 28b and bonded to the first electronic component 21 through a bonding layer 29, wherein the first conductive elements 28a are different in structure from the second conductive elements 28b; and a first encapsulant 23 formed between the first substrate 20 and the second substrate 22 encapsulating the first electronic component 21, the first conductive elements 28a and the second conductive elements 28b.

The first electronic component 21 can be disposed on the first substrate 20 through a plurality of conductive bumps 210.

Each of the first conductive elements 28a can be a metal bump, or has a metal bump 280 and a conductive material 281 encapsulating the metal bump 280. Each of the second conductive elements 28b can be a solder bump.

In an embodiment, the ratio of the number of the first conductive elements 28a to the number of the second conductive elements 28b is 1:0.5 to 1:1.5.

In an embodiment, the bonding layer 29 is made of a thin film or a heat dissipating material.

In an embodiment, a chip mounting area C and a first stack area A and a second stack area B surrounding the chip mounting area C are defined on a surface of the first substrate 20, the first electronic component 21 is disposed on the chip mounting area C, a plurality of conductive pads 201, 202 are disposed on the first stack area A and the second stack area B to bond with the first conductive elements 28a and/or the second conductive elements 28b, and the density of the conductive pads 201, 202 on the first stack area A is greater than the density of the conductive pads 202 on the second stack area B.

In an embodiment, the first substrate 20 has a positioning pad 30.

In an embodiment, the first conductive elements 28a and the second conductive elements 28b are alternately arranged.

In an embodiment, a supporting member 27 is further disposed between the first substrate 20 and the second substrate 22. In an embodiment, the supporting member 27 is not electrically connected to the first substrate 20 or the second substrate 22.

In an embodiment, the electronic package 2' further has a second electronic component 24 disposed on the second substrate 22, and a second encapsulant 25 formed on the second substrate 22 and encapsulating the second electronic component 24.

In an embodiment, the electronic package 2" further has at least one package 26 disposed on the second substrate 22.

According to the present disclosure, the first conductive elements and the second conductive elements of different structures are provided to support the second substrate, thereby preventing bridging of the conductive elements and cracking of the second substrate during a molding process.

Further, by bonding the second substrate to the first electronic component, the present disclosure achieves a good supporting effect and improves the product yield.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
    a first substrate;
    a first electronic component having a first surface and a second surface opposite to the first surface, the first electronic component being disposed on the first substrate through a plurality of conductive bumps formed on the first surface in a flip-chip manner, wherein the first electronic component is a semiconductor component;
    a second substrate stacked on the first substrate through a plurality of first conductive elements and a plurality of second conductive elements and bonded to the second surface of the first electronic component through a bonding layer, wherein the first conductive elements are different in structure from the second conductive elements, and the bonding layer is in direct contact with the first electronic component and the second substrate; and
    a first encapsulant formed between the first substrate and the second substrate and encapsulating the first electronic component, the bonding layer, the first conductive elements and the second conductive elements, wherein the bonding layer is a stress-absorbing layer configured to absorb stresses of an upward pushing force generated by the first encapsulant for the second surface of the first electronic component.

2. The electronic package of claim 1, wherein a ratio of a number of the first conductive elements to a number of the second conductive elements is 1:0.5 to 1:1.5.

3. The electronic package of claim 1, wherein the first conductive elements are metal bumps.

4. The electronic package of claim 1, wherein the first conductive elements are metal bumps encapsulated by a conductive material.

5. The electronic package of claim 1, wherein the second conductive elements are solder bumps.

6. The electronic package of claim 1, wherein the bonding layer is made of a thin film or a heat dissipating material.

7. The electronic package of claim 1, wherein a surface of the first substrate is defined with a chip mounting area and a first stack area and a second stack area surrounding the chip mounting area, and wherein the first electronic component is disposed on the chip mounting area, and a plurality of conductive pads are disposed on the first stack area and the second stack area and bonded with at least one of the first conductive elements and the second conductive elements.

8. The electronic package of claim 7, wherein a density of the conductive pads on the first stack area is greater than a density of the conductive pads on the second stack area.

9. The electronic package of claim 1, further comprising a positioning pad disposed on the first substrate.

10. The electronic package of claim 1, wherein the first conductive elements and the second conductive elements are alternately arranged.

11. The electronic package of claim 1, further comprising a supporting member disposed between the first substrate and the second substrate.

12. The electronic package of claim 11, wherein the supporting member is free from being electrically connected to the first substrate or the second substrate.

13. The electronic package of claim 1, further comprising a second electronic component disposed on the second substrate.

14. The electronic package of claim 13, further comprising a second encapsulant formed on the second substrate and encapsulating the second electronic component.

15. The electronic package of claim 1, further comprising an additional package disposed on the second substrate.

16. A method for fabricating an electronic package, comprising:
    providing a first substrate and a second substrate with a first electronic component having a first surface and a second surface opposite to the first surface and being disposed on the first substrate through a plurality of conductive bumps formed on the first surface in a flip-chip manner, wherein the first electronic component is a semiconductor component;

stacking the second substrate on the first substrate through a plurality of first conductive elements and a plurality of second conductive elements, and bonding the second substrate to the second surface of the first electronic component through a bonding layer, wherein the first conductive elements are different in structure from the second conductive elements, and the bonding layer is in direct contact with the first electronic component and the second substrate; and forming between the first substrate and the second substrate a first encapsulant encapsulating the first electronic component, the bonding layer, the first conductive elements and the second conductive elements, wherein the bonding layer is configured to absorb stresses of an upward pushing force generated by the first encapsulant for the second surface of the first electronic component.

17. The method of claim 16, wherein a ratio of a number of the first conductive elements to a number of the second conductive elements is 1:0.5 to 1:1.5.

18. The method of claim 16, wherein the first conductive elements are metal bumps.

19. The method of claim 16, wherein the first conductive elements are metal bumps encapsulated by a conductive material.

20. The method of claim 16, wherein the second conductive elements are solder bumps.

21. The method of claim 16, wherein the bonding layer is made of a thin film or a heat dissipating material.

22. The method of claim 16, wherein a surface of the first substrate is defined with a chip mounting area and a first stack area and a second stack area surrounding the chip mounting area, and wherein the first electronic component is disposed on the chip mounting area, and a plurality of conductive pads are disposed on the first stack area and the second stack area and bonded with at least one of the first conductive elements and the second conductive elements.

23. The method of claim 22, wherein a density of the conductive pads on the first stack area is greater than a density of the conductive pads on the second stack area.

24. The method of claim 16, further comprising providing a positioning pad on the first substrate.

25. The method of claim 16, wherein the first conductive elements and the second conductive elements are alternately arranged.

26. The method of claim 16, further comprising disposing a supporting member between the first substrate and the second substrate.

27. The method of claim 26, wherein the supporting member is free from being electrically connected to the first substrate or the second substrate.

28. The method of claim 16, further comprising disposing a second electronic component on the second substrate.

29. The method of claim 28, further comprising forming on the second substrate a second encapsulant encapsulating the second electronic component.

30. The method of claim 16, further comprising disposing an additional package on the second substrate.

* * * * *